United States Patent
Backer et al.

(10) Patent No.: US 7,727,579 B2
(45) Date of Patent: Jun. 1, 2010

(54) PROCESS FOR THE PRODUCTION OF HIGHLY-TEXTURED, BAND-SHAPED, HIGH-TEMPERATURE SUPERCONDUCTORS

(75) Inventors: Michael Backer, Cologne (DE); Brigitte Schlobach, Bannewitz (DE); Kerstin Knoth, Dresden (DE); Barbara Schupp-Niewa, Hallbergmoos (DE); Ruben Huhne, Dresden (DE); Martina Falter, Swisttal-Buschhoven (DE)

(73) Assignee: Zenergy Power GmbH (DE)

( * ) Notice: Subject to any disclaimer, the term of this patent is extended or adjusted under 35 U.S.C. 154(b) by 732 days.

(21) Appl. No.: 11/671,120

(22) Filed: Feb. 5, 2007

(65) Prior Publication Data

US 2007/0197045 A1 Aug. 23, 2007

Related U.S. Application Data

(63) Continuation of application No. PCT/EP2005/008534, filed on Aug. 5, 2005.

(30) Foreign Application Priority Data

Aug. 5, 2004 (DE) ........................ 10 2004 038 030

(51) Int. Cl.
 *B05D 5/12* (2006.01)
 *H01L 39/24* (2006.01)
(52) U.S. Cl. ...................... 427/62; 505/430; 505/434; 505/470; 505/741
(58) Field of Classification Search ................... 427/62; 505/430, 434, 470, 741
See application file for complete search history.

(56) References Cited

U.S. PATENT DOCUMENTS

2008/0039330 A1* 2/2008 Wolf et al. .................. 505/100
2009/0137401 A1* 5/2009 Paranthaman et al. ....... 505/470

OTHER PUBLICATIONS

Celik E et al: "Nb-doped SrTiO3 buffer layers on LaAlO3 substrates by metalorganic deposition for YBCO superconducting films", Materials Science and Engineering B, Elsevier Sequoia, Lausanne, CH, vol. 110, No. 1, Jun. 25, 2004, pp. 94-102, XP004507156 ISSN: 0921-5107 the whole document.

Castano O et al: "Epitaxial nucleation and growth of buffer layers and Y123 coated conductors deposited by metal-organic decomposition", Physica C, North-Holland Publishing, Amsterdam, NL, vol. 372-376, Aug. 2002, pp. 806-809, XP004375539 ISSN: 0921-4534 the whole document.

(Continued)

*Primary Examiner*—Brian K Talbot
(74) *Attorney, Agent, or Firm*—Edell, Shapiro & Finnan, LLC

(57) ABSTRACT

The formation of band-shaped HTSL on a metal substrate is disclosed. The HTSL includes at least one buffer layer comprising zirconates and/or rare-earth oxides. The HTSL layer is formed on the buffer layer. The buffer layer has a texturing that in the case of a RHEED measurement results in discrete reflexes and not only in diffraction rings. In particular, the buffer layer may be textured along its interface with the HTSL layer.

22 Claims, 11 Drawing Sheets

OTHER PUBLICATIONS

Chirayil T G et al: "Epitaxial growth of La2Zr207 thin films on rolled Ni-substrates by sol-gel process for high Tc superconducting tapes", Physica C, North-Holland Publishing, Amsterdam, NL, vol. 336, No. 1-2, Jul. 2000, pp. 63-69, XP004208161 ISSN: 0921-4534 the whole document.

Celik E et al: "Fabrication of La2Zr207 buffer layers on Ni tapes by reel-to-reel sol-gel technique", Materials Science and Engineering B, Elsevier Sequoia, Lausanne, CH, vol. 106, No. 2, Jan. 25, 2004, pp. 182-190, XP004482186 ISSN: 0921-5107 the whole document.

Bhuiyan M S et al: "MOD approach for the growth of epitaxial Ce02 buffer layers on biaxially textured Ni-W substrates for YBCO coated conductors", Supercond. Sci. Technol., vol. 16, Oct. 17, 2003, pp. 1305-1309, XP002362939 UK the whole document.

Annavarapu S et al: "Progress towards a low-cost coated conductor technology", Physica C, North-Holland Publishing, Amsterdam, NL, vol. 341-348, Nov. 2000, pp. 2319-2322, XP004761706 ISSN: 0921-4534 the whole document.

\* cited by examiner

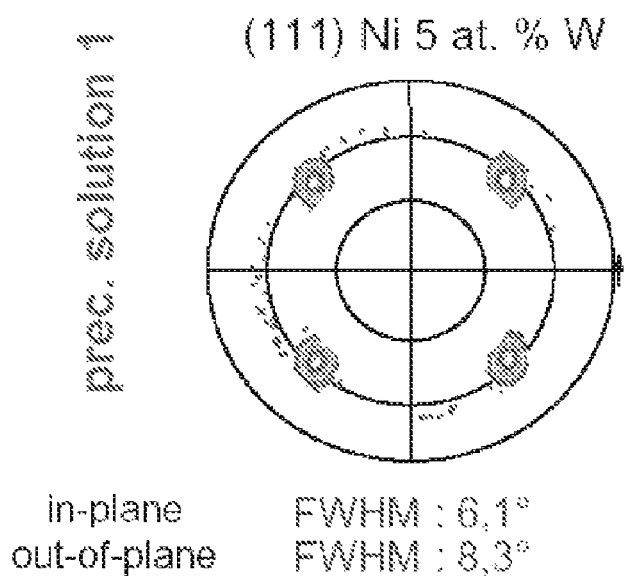
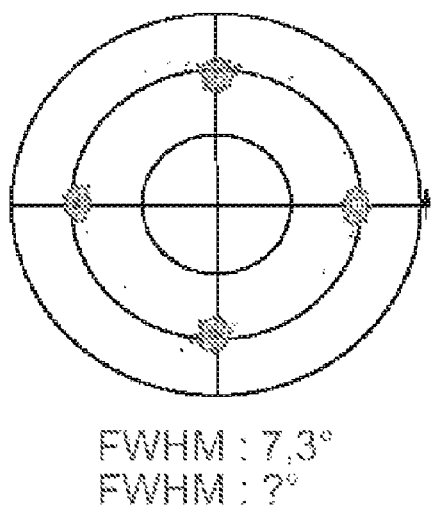
FIG.5A      FIG.5B
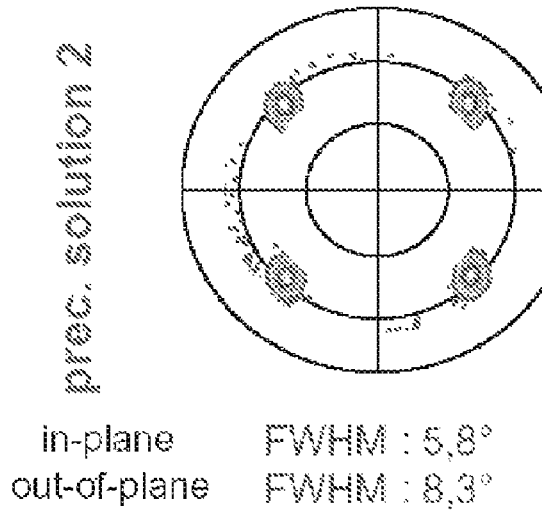
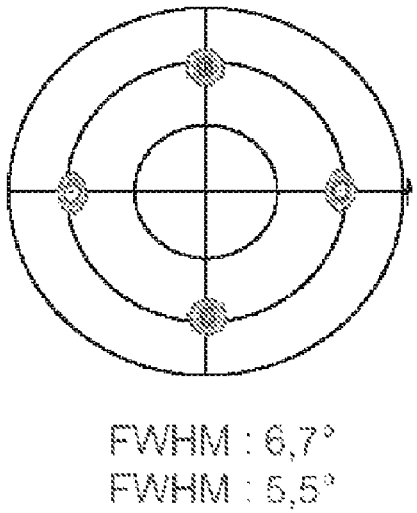
FIG.5C      FIG.5D

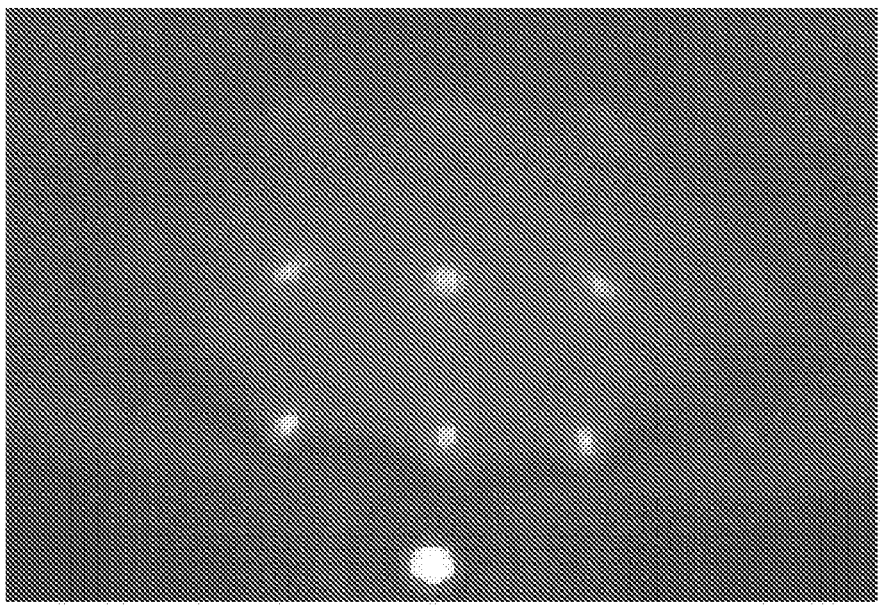
FIG.5F 0° IN-PLANE
FIG.5E 0° IN-PLANE

FIG. 7B  Y₂O₃ - SOLUTION #2  0° IN-PLANE
FIG. 7A  Y₂O₃ - SOLUTION #1  0° IN-PLANE Ni(III) 5% W
IN-PLANE      FWHM=5.8°
OUT-OF-PLANE  FWHM=6.0°

LZO(222)
IN-PLANE      FWHM=5.7°
OUT-OF-PLANE  FWHM=6.9°

CGO(III)
IN-PLANE      FWHM=8.6°
OUT-OF-PLANE  FWHM=7.2°

PROCESS FOR THE PRODUCTION OF HIGHLY-TEXTURED, BAND-SHAPED, HIGH-TEMPERATURE SUPERCONDUCTORS

CROSS REFERENCE TO RELATED APPLICATIONS

This application is a continuation of International Application No. PCT/EP2005/008534, filed on Aug. 5, 2005, entitled "Process for the Production of Highly-Textured, Band-Shaped, High-Temperature Superconductors," which claims priority under 35 U.S.C. §119 to Application No. DE 102004038030.9 filed on Aug. 5, 2004, entitled "Process for the Production of Highly-Textured, Band-Shaped, High-Temperature Superconductors," the entire contents of which are hereby incorporated by reference.

FIELD OF THE INVENTION

The invention relates to a process for the production of highly-textured, band-shaped, high-temperature superconductors, as well as the intermediate and end products of the process.

BACKGROUND

Several cuprate superconductors are capable of superconducting above the boiling point of liquid nitrogen (77° K). These cuprate superconductors (called high-temperature superconductors (HTSL)), however, have poor mechanical properties. The development of band lines is an attempt to overcome the associated problems.

Band lines (also know as band-HTSL or band-shaped HTSL) are coated conductors including a superconducting functional layer applied to a band-shaped substrate via a special process. The functional layer may include, e.g., yttrium-barium-copper-oxide $YBa_2Cu_3O_x$ (YBCO). As shown in FIG. 1, these band lines have a structure including a metal substrate, a buffer layer, and a superconductor layer. The economic efficiency of the production process is decisively determined by the precipitation process. The main difficulty in the production of coated conductors is that the superconductor layer must have an extremely high degree of texture, that is, a high degree of crystallographic orientation. The individual crystallites of the layer should be tilted against one another only by a minimum value, since otherwise the superconducting properties are severely impaired.

To achieve such a high degree of texture, two different preparation processes may be utilized. It is common to both preparations that, before the superconducting layer is deposited, a textured buffer layer is produced and placed on the substrate. Thus, when the superconducting layer is deposited on the buffer layer, the texture (orientation) is transferred to the superconducting layer. In the two preparations, metal substrates are used, since this is the only way that the strength of the band lines necessary for later use in electrical technology can be achieved.

In the first preparation process, an untextured, crystallographically-non-oriented metal substrate formed from, e.g., Hastelloy® alloy is used. A textured buffer layer (i.e., a buffer layer with crystallographic orientation) is then applied to the untextured substrate. Such a direct deposition can be carried out only using physical coating processes under high vacuum (e.g., Ion Beam Assisted Deposition (IBAD) and Inclined Substrate Deposition (ISD)). Drawbacks of this process are high equipment costs (caused, for example, by the high vacuum pressure requirements) and a low deposition rate. In the second preparation, the metal substrate is already textured by special deformation and temperature treatment processes. The texture of the substrate can thus be transferred to the buffer layer and, in turn, to the superconducting layer deposited thereon. The advantage of this method is that no direct deposition processes must be used. Here, physical processes, such as Pulsed Laser Deposition (PLD) and Thermal Co-Evaporation (TCE) and chemical processes, such as Chemical Solution Deposition (CSD) and Metal-Organic Chemical Vapor Deposition (MOCVD) may be used. Again the PLD and TCE processes require high vacuum pressure (and thus high equipment costs), even though they provide higher deposition rates than direct deposition processes.

Chemical coating processes (e.g., Chemical Solution Deposition (CSD)) are economical relative to physical coating processes since they work at normal pressure (i.e., without the need for high vacuum pressure), while providing a higher deposition rate. FIG. 2 shows two CSD processes. As shown, on the laboratory scale, coating with CSD processes may be carried out as a "dip-coating" process (FIG. 2A), in which the substrate is immersed into a solution and pulled back out, or as a "spin coating" process (FIG. 2B), wherein several drops of the solution are applied to a substrate and distributed by rotating the substrate (centrifugal force spreads the solution on the substrate). For production of greater lengths, the substrate band can be drawn through a coating solution and then dried in a furnace. A diagram of such a system can be seen in FIG. 3. As shown, the system includes a rinsing (take-off) unit, a coating unit, a drying unit, and a winding unit. The subsequent reaction is carried out at a high temperature.

A Coated Conductor Architecture or Shift Sequence while eliminating the buffer layer is not possible from a physical standpoint, since this layer is required primarily as a diffusion barrier. On the one hand, the buffer layer is to prevent metal atoms from the metal band substrate (e.g., nickel) from diffusing into the superconductor layer during annealing, which would contaminate the layer and thus degrade its superconducting properties. On the other hand, the buffer layer acts as an oxygen barrier, thus also no oxygen can diffuse through the buffer layer to the metal substrate band in the subsequent annealing treatment. There, it would result in the formation of a metal oxide barrier layer, which can result in the flaking of the buffer and superconductor layers.

Because of the above-mentioned advantages, the use of a textured metal substrate band, on which a buffer layer and the actual superconductor layer are applied by chemical deposition, is preferred as a production process for coated conductors. In this case, the individual deposition steps are followed by an annealing treatment, in which the deposited materials are crystallized to form texture that is transferred to the subjacent layer or the substrate. This process is a so-called "all-solution" process, which originates, relative to the coatings, only from solutions of individual components and a coating at ambient pressure.

While yttrium-barium-copper oxide (YBCO) is typically used in forming the superconducting layer, many compounds can be used to form the buffer layer. The basic requirement is the property of being deposited in a textured fashion and of passing on this texture to the superconductor layer. In addition to single layers, multilayer buffer layer systems are also used. Typically used buffer layer materials include yttrium-stabilized zirconium oxide, gadolinium zirconate, yttrium oxide, lanthanum aluminate, lanthanum zirconate, strontium titanate, nickel oxide, cerium oxide, magnesium oxide, lanthanum manganate, and strontium ruthenate.

To date, no band line having a high elastic current density similar to band lines in which at least one layer was applied by means of physical methods (e.g., Pulsed Laser Deposition (PLD)) could be produced using the "all-solution" processes. Producing Coated Conductors via CSD processes has been unsuccessful in the making of buffer layers capable of transferring their texture to the superconductor layer. It has been shown that even a deposition of the superconductor layer with physical methods (which results in demonstrably high-quality layers on physically deposited buffer layers) results only in a slight texture of the superconductor layer on CSD buffer layers and, as such, results in poor superconducting properties. This can be substantiated by a lack of texture transfer.

In addition to providing poor texture transfer capability of CSD buffer layers, depositing buffer layers via CSD processes starts mainly from solutions on which 2-methoxyethanol is based as a solvent. This solvent is classified as toxic, embryotoxic, and fertility-damaging and, therefore, is rather unsuitable for laboratory use as well as for technical applications. In addition, the starting substances for the example of the production of $La_2Zr_2O_7$ (lanthanum-isopropoxide and zirconium-n-propoxide) are moisture-sensitive, so that the production of the solution must take place under inert atmosphere.

Another drawback of CSD processes for applying the buffer layers are the required high temperatures for crystallization of the buffer layers, which often lie considerably above 1000° C. and thus greatly limit the selection of suitable metal substrates. In addition, even in the case of substrates that have a sufficiently high melting point or softening temperature, the diffusion speed at temperatures above 1000° C. are so high that high levels of contaminants of diffused-in metal atoms from the substrate can be detected in the buffer layers.

SUMMARY

An object of the invention consists in further developing the Chemical Solution Deposition (CSD) process for the production of band-shaped HTSL (high-temperature superconductor layers) with improved texture transfer capability of the buffer layer.

This an other objects of the invention is achieved by the use of polar solvents with free hydroxyl groups as a solvent for the buffer substances and the adaptation of the deposition conditions to the new coating solutions. Using polar solvents with free hydroxyl groups (e.g., propionic acid) provides high texture transfer capability, while avoiding the use toxic solvents as well as reducing the annealing temperature required to process the HTSL.

BRIEF DESCRIPTION OF THE DRAWINGS

FIG. 2 illustrates schematic drawings of chemical solution deposition (CSD) coating processes. Specifically.

FIG. 5 illustrates pole figures (FIGS. 5A-5D) and results of reflection high energy electron diffraction (RHEED) measurements (FIGS. 5E-5F) for $La_2Zr_2O_7$ buffer layers on Ni—5 w % substrate. Specifically, FIGS. 5A and 5B illustrate pole figures for coated conductors formed using prior art solvents (Solution #1), while FIG. 5E illustrates the corresponding RHEED measurement. Similarly, FIGS. 5C and 5D illustrate pole figures for coated conductors formed using solvents in accordance with an embodiment of the invention (Solution #2), while FIG. 5F shows the corresponding RHEED measurement.

FIG. 7 illustrates RHEED measurement results on $Y_2O_3$ buffer layers made of a prior art solution (Solution #1) (FIG. 7A) and a solution in accordance with an embodiment of the present invention (Solution #2) (FIG. 7B).

DETAILED DESCRIPTION

Figure 1:
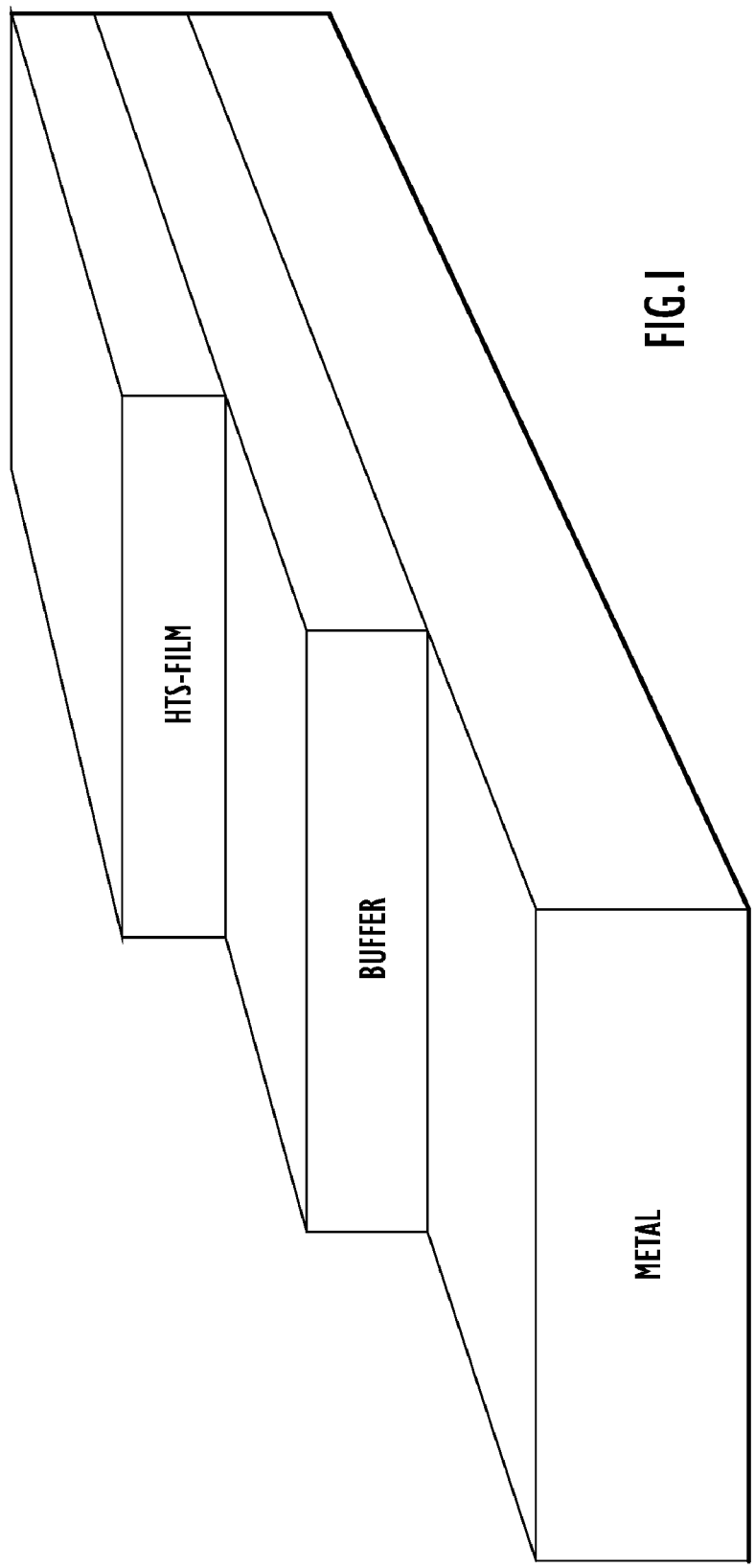
FIG. 1 illustrates the structure of a band-shaped HTSL in accordance with an embodiment of the invention.

For the development of new processes and coating systems, which satisfy at least the object of a high texture transfer capability, first the causes of the lack of texture transfer from buffers to superconductors in the case of conventional CSD coating must be clarified. The examination of the entire texture of the buffer layer is carried out in most cases via x-ray or electron diffraction. The depth of penetration of these measuring methods—i.e., the material depths are obtained from the measuring data—is greater than the thickness of the layer to be measured. With corresponding measurements, very good texture values with typical half-power bandwidths in the range of 6-7° ($2\theta$) (which can be calculated from pole figures) were obtained in all previously deposited buffer layers. This number of degrees is a measure of the scattering of the crystal orientations around the ideal value. The values measured in the buffer layers that are deposited via the CSD processes correspond to those that were measured in the physically deposited buffer layers. Because of the measured values, it should therefore be possible in principle to deposit comparably well textured YBCO layers on the CSD buffer. This deposition is possible, however, only at a comparatively very low degree of texturing and thus poor superconducting properties. These standard diffraction measurements were therefore unsuitable for detecting the texture transfer capability of the buffer layer.

Since the texture transfer must be carried out by the topmost cover layer of the buffer layer, this layer was examined by means of Reflection High-Energy Electron Diffraction (RHEED). The results of these measurements on conventional, CSD-produced buffer layers showed that an amorphous cover layer that is barely one nanometer thick is found on the very well-textured CSD buffer layer in the interior, and the amorphous cover layer could be observed in all common buffer systems (for example $La_2Zr_2O_7$ (LZO), $CeO_2/Gd_2O_3$, and Y-stabilized $ZrO_2$ (YSZ)) deposited by means of CSD. This amorphous cover layer prevents qualitatively high-value superconductor layers from being able to be deposited on buffer layers, which were produced with conventional coating solutions and processes via CSD. A buffer layer with a high texture transfer capability must therefore show, in RHEED measurements, a high degree of texture even for the outermost buffer layer (i.e., up to the surface of the buffer layer).

Coating solutions and process parameters according to the invention ensure that the previously observed, amorphous cover layer does not form and the buffer layer completely crystallizes up to the surface. This finding was clearly verified by means of RHEED images of the buffer layers produced according to the invention. Buffer layers according to the invention thus make possible for the first time the production of high-grade coated conductors via the "all-solution" process, or in other words, the deposition of qualitatively high-grade superconductor layers on CSD buffer layers.

When using polar solvents with free hydroxyl groups, improved crystallinity (and tus improved texture) of the surface of the buffer layers could be achieved. Accordingly, polar solvents with free hydroxyl groups, e.g., carboxylic acids such as propionic acid, are advantageous as solvents. This class of polar solvents also has the advantage that they could easily etch the metal substrate surface and thus purify, making possible an optimum texture development from this side. In addition, the carboxylic acids have the advantage that they are not classified as harmful to health. The commercial conversion of the process with these solvents can be done in this case both with respect to the safety of the employees and with respect to the economy of the process, by less necessary equipment safety measures that are considerably more advantageous in comparison to the use of conventional solvents.

Advantageous buffer systems that can be produced utilizing the process according to the invention may include zirconates and/or rare earth oxides. Concrete examples of such buffer systems are yttrium oxide, cerium oxide or gadolinium-doped cerium oxide. These different buffer systems can also be combined in a multi-layer buffer system.

For the production of the coating solutions, it may be advantageous to heat and/or stir the solutions so that they boil under reflux. In addition, various additives can be mixed in the coating solution to have a positive influence on the coating process and to increase the stability of the solution. To improve the process, for example, wetting agents may be used (the agents reduce the surface tension of the coating solution and thus make possible a uniform coating over the surface and on the edges, while at the same time counteracting the formation of drops/beads during drying). In addition, gelling agents, which make possible a uniform drying of the coating without flakes, cracks and pores, may be used. To stabilize the solutions, e.g., antioxidants can also be used.

Figure 2B:
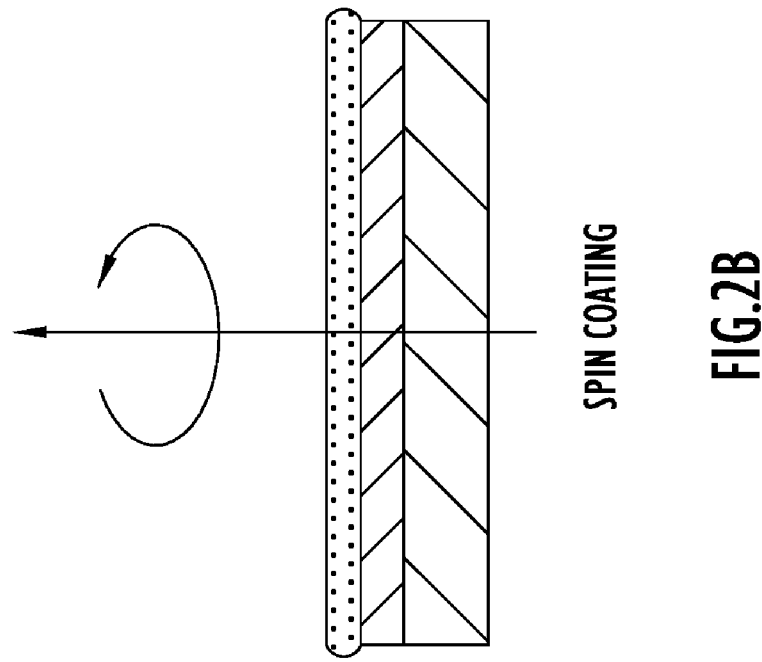
FIG. 2A illustrates a dip coating process and FIG. 2B illustrates a spin coating process.
Figure 2A:
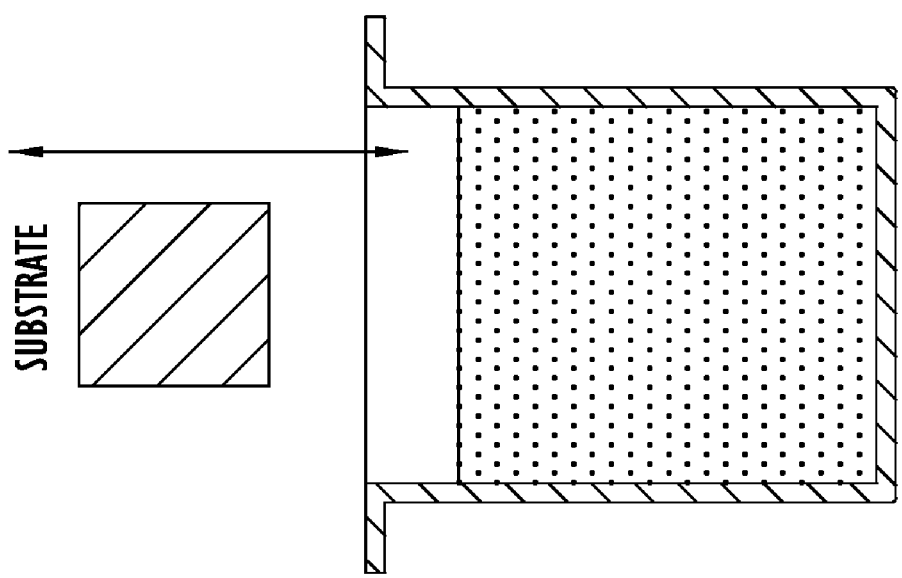

The coating of the substrate with the coating solution according to the invention can be carried out in various ways. The solution can be applied by dip-coating (dipping of the substrate in the solution (FIG. 2A)), spin-coating (applying the solution to a rotating substrate (FIG. 2B)), spray-coating (spraying or atomizing the solution on the substrate), capillary coating (applying the solution via a capillary), ink-jet printing, and similar techniques. In the application of the solution, structures in the buffer layer can optionally be produced either by specific protection of areas, e.g., by means of photoresist and removal after the coating, or by the process itself, e.g., in the printing process such as the ink-jet printing.

Figure 3:
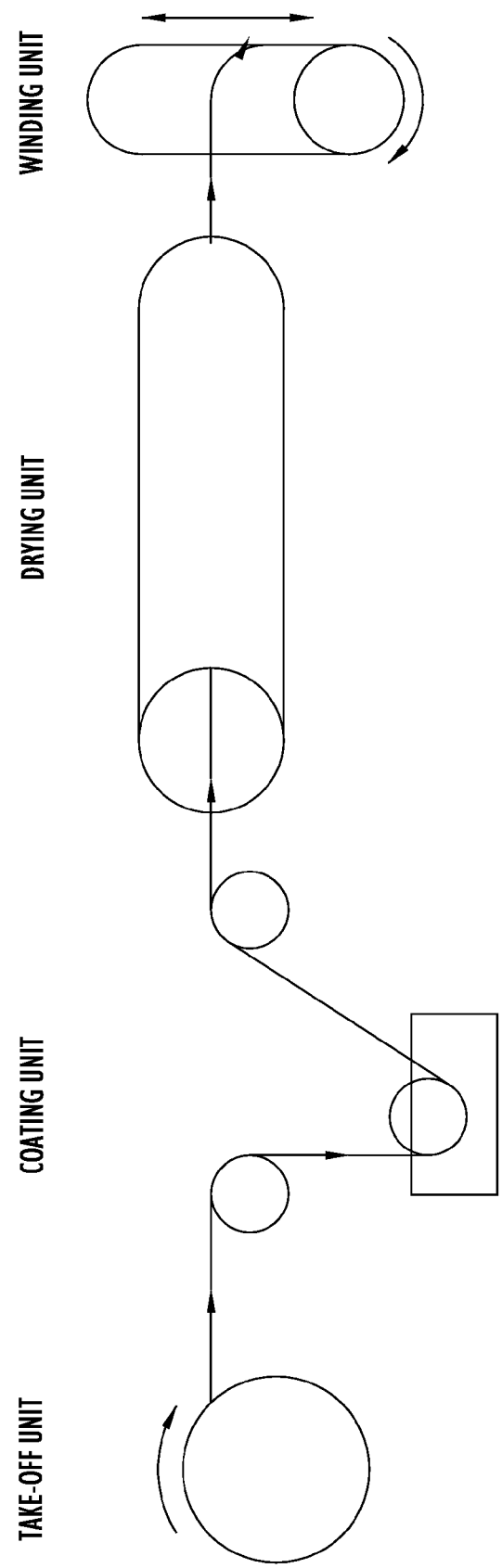
FIG. 3 illustrates a system for continuous coating via a CSD process in accordance with an embodiment of the invention.

The coating and drying can generally be carried out both in the batch process and continuously. Because of the lower handling cost, continuous systems are preferred here. An exemplary continuous system is illustrated in FIG. 3. As shown, these systems may include a rinsing unit with an active or passive brake to keep the substrate band in the system under tension. This can be achieved by, e.g., a so-called dancer (double deflecting rollers with defined tensile force). The substrate band is then guided by the coating unit (e.g., a dipping bath). By arranging the guide rollers in different ways, different angles can be achieved for drawing the substrate band from the coating solution into the bath. The bath may also be heated to increase the solubility of individual components in the solvent. After coating, the drying of the coating is carried out in a drying section (drying unit). This section can be operated both at one temperature and at several temperatures and temperature variations. For example, an at least two-stage drying process, in which a low temperature T1 treatment (wherein T1 is slightly below the boiling point of the solvent) and a high temperature T2 treatment (wherein T2 is above the boiling point of the solvent) are used, is preferred. This provides an especially homogeneous (and thus crack- and pore-free) drying process.

After the drying, the band is wound up again on a winding unit. Winding the band on a carrier pipe in the form of a flat coil (solenoid) is advantageous for the subsequent annealing treatment. This takes place by a simultaneous rotational and linear movement of the coil winder. A carrier for the band is, e.g., a heat-resisting ceramic pipe or a coated metal pipe. The various units, in particular, the coating unit and the drying unit, are advantageously configured such that the process can take place under a defined atmosphere. In the various units, it may be advantageous to set different atmospheres. For example, a higher vapor pressure of the solvent in the coating unit may be advantageous to avoid excessive evaporation of the solvent from the coating bath and thus to avoid a concentration of the coating solution.

In addition to the texturing that is achieved by the coating according to the invention, the process parameters of the subsequent annealing treatment are also important for the technical applicability and the economy of the coating process. In the case of buffer layers that are deposited according to the invention, crystallization sets in even at considerably lower temperatures than those in the conventional coating solutions or solvents. The purified surface seems to transfer the texture of the metal substrate band more quickly and faultlessly to the buffer layer. As typical process temperatures for the annealing treatment, temperatures of 800-900° C. were identified.

The low annealing temperatures in the coating according to the invention for the first time allow a continuous coating apparatus to be configured such that the final annealing treatment can be carried out continuously in a line with the coating and drying. This was previously prevented by the required high temperatures, as well as the induced softening of the substrate band, which keeps the band from being transported through the equipment by pulling.

Examples and tests comparing the prior art solution with solutions of the present invention follow.

Example 1

In reproducible tests, $La_2Zr_2O_7$ (LZO) was applied as a buffer layer to a textured metal band. The metal band used was a pure nickel band. By alloying in tungsten up to a proportion of 8%, the tensile strength of the band can be increased without affecting the result of the coating in this example. Also, other alloys, such as, e.g., Ni—O, 1% Mn, can be used without affecting the final result of this example. In comparison tests, different coating solutions were used, whereby the first solution corresponds to the prior art, while the second solution is in accordance with the invention.

Lanthanum(III) 2,4-pentanedionate (La$[CH_3COCHCOCH_3]_3 \cdot xH_2O$, 99.9% (REO), powder, melting point: 143° C. (available from Alfa Aesar®, Ward Hill, Mass., www.alfa.com)) and zirconium(IV) 2,4-pentanedionate (Zr[CH$_3$COCHCOCH$_3$]$_4$, ≧98%, crystalline (available from Strem Chemicals, Newburyport, Mass., www.strem.com)) are the basis of both coating solutions. Both solutions were set at a concentration of 0.1 M relative to La$_2$Zr$_2$O$_7$ according to buffer stoichiometry. Higher or lower concentrations can be compensated for within limits (0.05-0.4 M) by varying the drawing speed (see below) without affecting the result. For specified setting of the metal contents, the starting substances were characterized by means of Inductively Coupled Plasma Optical Emission (ICP-OES). As a solvent for Solution #1, acetyl acetone (2,4-pentanedione, CH$_3$COCH$_2$COCH$_3$, ≧99.5%, melting point −23° C., boiling point 140° C., flash point 34° C. (available from Merck, www.merck.com)) was used with the addition of isobutylamine (1-amino-2-methyl-propane, (CH$_3$)$_2$CHCH$_2$NH$_2$, >98%, melting point −85° C., boiling point 68° C., flash point −10° C. (also available from Merck)). A polar solvent with free hydroxyl groups was used as the solvent for Solution #2. Specifically, propionic acid (CH$_3$CH$_2$COOH, >99%, melting point −21° C., boiling point 141° C., flash point 50° C. (available from Merck)) was used as the solvent for Solution #2.

The coating was carried out on substrate pieces with the dimensions 10×10×0.08 mm$^3$ by means of a dipping apparatus. The samples were drawn out of the coating solution at a rate of 0.2 cm/s and at an angle of 90° to the solution surface. The rate can be reduced to up to 0.05 cm/s; however, rates lower than this produce too small a layer thickness. The rate can be increased to up to 0.5 cm/s; above this rate, however, excessive layer thicknesses are produced, forming cracks in the subsequent temperature treatment process.

Figure 4:
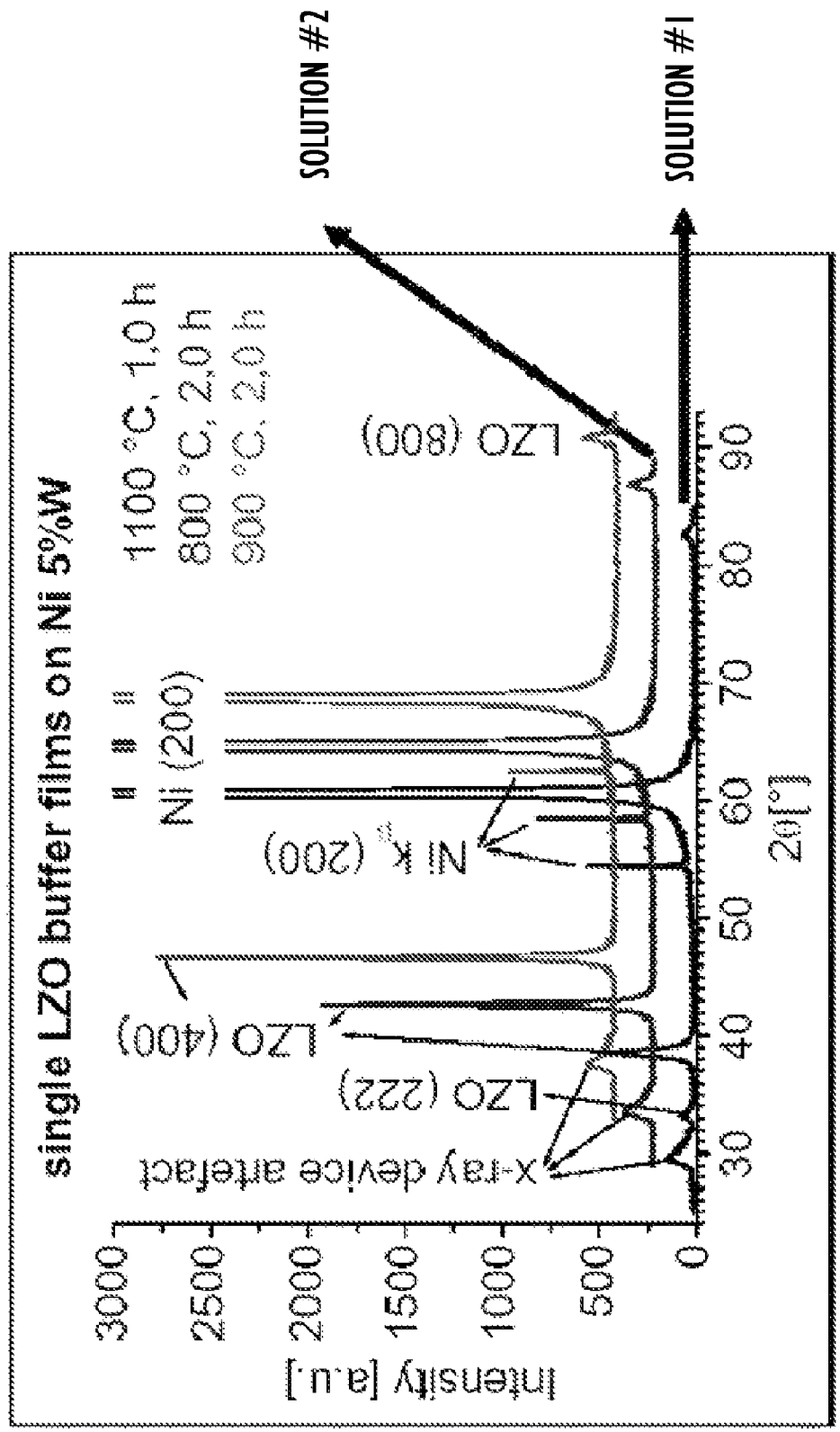
FIG. 4 illustrates an x-ray of crystallized $La_2Zr_2O_7$ (LZO) layers of prior art solutions, as well as solutions in accordance with an embodiment of the invention.

After drying at 60° C. within five (5) hours in air, the samples were subjected to different annealing treatments. The drying is carried out below the boiling point of the solvent (methanol, 64.5° C.) to prevent the formation of bubbles by boiling. Referring to FIG. 4, the x-ray diffraction diagrams show a texture in all samples; however, the texture of the samples that were produced with Solution #2 is improved because of the error of the LZO (222) reflex, as well as significantly higher intensities of the (h00) reflexes in the x-ray diffraction diffractogram.

In addition, the process temperature required for the crystallization of the buffer layer in Solution #2 is lower than that necessary for Solution #1 (the coating solution according to the prior art). Referring to FIG. 4, while in the case of Solution #1, a temperature of about 1100° C. (1 hour) is required, in the case of Solution #2, the annealing at temperatures of considerably below 1000° C.—at about 800 or about 900° C.—can be carried out in each case for 2 hours. In both cases, an inert gas atmosphere (Ar/5% H$_2$) is required. The inert gas atmosphere is selected in this case such that, on the one hand, the metal band is not oxidized and, on the other hand, the oxide layer can still be formed. While the x-ray diffraction diagrams of the layers already show slight differences between the solutions, a clear difference can be noted via RHEED images, which show the texture of the uppermost nanometer range of the buffer layer. FIG. 5 shows pole figures of the metal substrate and buffer layer, as well as the RHEED images of the different layers.

While the pole figures exhibit only slight differences, as expected, the RHEED image, in the case of Solution #1 (coating solution according to the prior art) shows only diffraction rings (FIG. 5E). Diffraction rings stand for an irregular, random arrangement of crystallites in the space. In other words, there is no texture at all in the outer area of the buffer layer that is being examined. In contrast, the RHEED image shows the buffer layer deposited with Solution #2 (the solution in accordance with an embodiment of the invention) includes discrete reflexes, which reveal a strong level of texturing in the examined area up to the surface of the buffer layer (FIG. 5F).

Example 2

Y$_2$O$_3$ was also applied in a reproducible manner via the CSD process to a textured metal band (Ni—5% W). In comparison tests, different coating solutions were already used as in Example 1. Solution #1 corresponded to the prior art, while the second solution (Solution #2) is in accordance with the invention.

In all tests, the starting substance was yttrium(III) 2,4-pentanedionate (Y(CH$_3$COCHCOCH$_3$)$_3$.xH$_2$O, 99.9%, powder (available from Alfa Aesar®)). The earlier precursor solutions were produced as solvents corresponding to the prior art by use of 2-methoxyethanol (CH$_3$OCH$_2$CH$_2$OH, for analysis, ACS, 99.3%, melting point −85° C., boiling point 124-125° C., flash point 46° C. (available from Merck)) or acetyl acetone (2,4-pentanedione) (CH$_3$COCH$_2$COCH$_3$, ≧99.5%, melting point −23° C., boiling point 140° C., flash point 34° C. (available from Merck)), methanol (CH$_3$OH, for analysis, ACS, ISO, ≧99.8%, melting point −98° C., boiling point 64.5° C., flash point 11° C. (available form Merck)), and isobutylamine (1-amino-2-methylpropane, (CH$_3$)$_2$CHCH$_2$NH$_2$, for synthesis, >98%, melting point −85° C., boiling point 68° C., flash point −10° C. (5-20% isobutylamine in acetyl acetone) (available from Merck)). In the production of the precursor solutions corresponding to the invention, these solvents were replaced from about 45 to about 100%, preferably about 90 to about 100%, by propionic acid (CH$_3$CH$_2$COOH (available from Merck) ≧99%, melting point −21° C., boiling point 141° C., flash point 50° C.).

The concentration of the solutions being examined was set at 0.125 M relative to Y$_2$O$_3$.

The coating was carried out on substrate pieces with the dimensions 10×10×0.08 mm$^3$ by means of a dipping apparatus. The samples were drawn out of the coating solution at a rate of 0.1 cm/s and at an angle of 90° to the solution surface.

After drying in air at 60° C. within 1 hour and then at 90° C. within 0.5 hour, the samples were annealed at 1000° C. for 1 hour in Ar/5% H$_2$.

Figure 6:
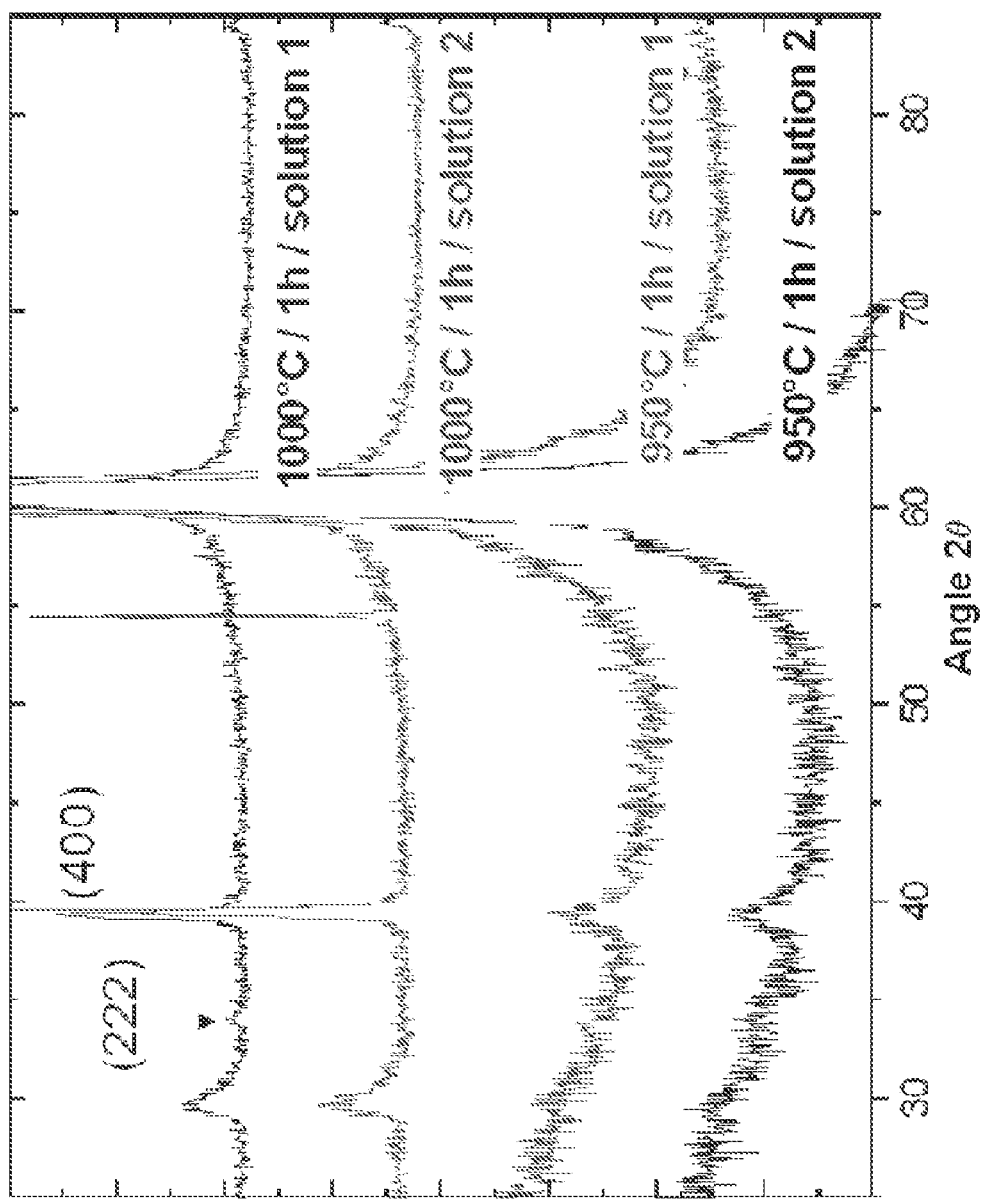
FIG. 6 illustrates x-ray diffraction patterns of crystallized $Y_2O_3$ layers for prior art solutions (Solution #1) and solutions in accordance with embodiments of the present invention (Solution #2) at various temperatures.

Referring to FIG. 6, the x-ray diffractograms of the layers produced with use of propionic acid show clearly higher intensities of the (h00) reflexes in the x-ray diffractogram than the Y$_2$O$_3$ layers obtained according to the prior art. The highest intensity of the Y$_2$O$_3$ (400) reflex was measured on a buffer layer, which was produced with a propionic acid content of 50% in the solvent composition. The good texture of the sample can be confirmed in addition by the error of the Y$_2$O$_3$ (222) reflex.

Referring to FIG. 7, the pole figures on layers produced without the addition of propionic acid show in-plane texture. Studies by means of RHEED yielded that these layers are textured not only up to the surface in the same quality, but that amorphous or polycrystalline portions are still present on the surface. In contrast to this, in-plane texture is present up to the surface in the layer that was produced according to the invention.

Example 3

In reproducible tests according to the invention, La$_2$Zr$_2$O$_7$ (LZO) was applied as a buffer layer to a textured metal band (Ni—5% W).

Lanthanum(III) 2,4-pentanedionate (La[CH$_3$COCHCOCH$_3$]$_3$.xH$_2$O, 99.9% (REO), powder, melting point 143° C. (available from Alfa Aesar®)) and zirconium (IV) 2,4-pentanedionate (Zr[CH$_3$COCHCOCH$_3$]$_4$, ≧98%, crystalline (available from Strem Chemicals)) are the basis of the coating solution. The solution was set at a concentration of 0.1 M relative to La$_2$Zr$_2$O$_7$ according to buffer stoichiometry.

For exact setting of the metal contents, the starting substances were characterized by means of Inductively Coupled Plasma Optical Emission (ICP-OES). As solvent for the solution, propionic acid (CH$_3$CH$_2$COOH, ≧99%, melting point −21° C., boiling point 141° C., flash point 50° C.) was used.

Figure 8:
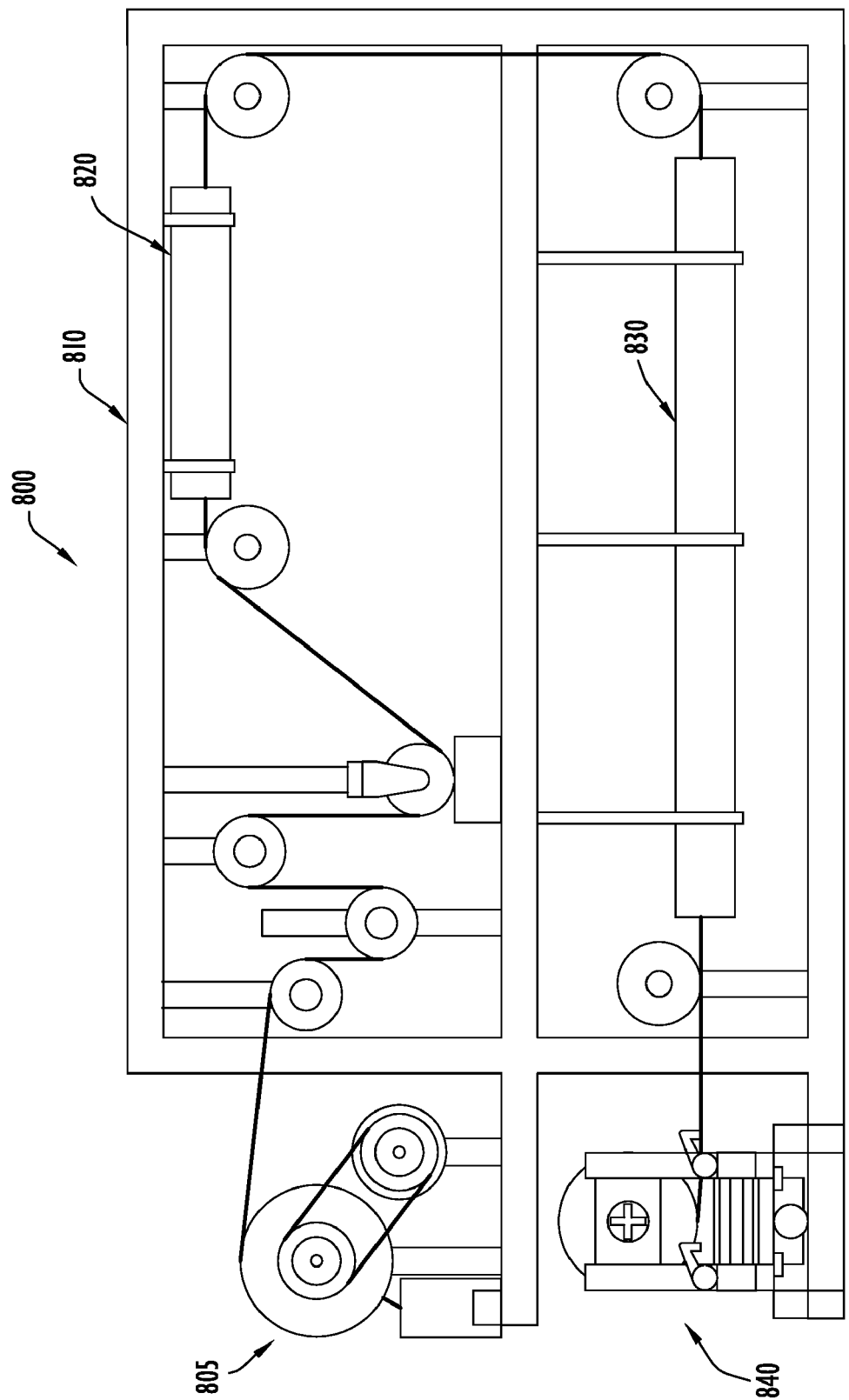
FIG. 8 illustrates an apparatus for manufacturing buffer layers by CSD method in accordance with an embodiment of the present invention.
Figure 9A:
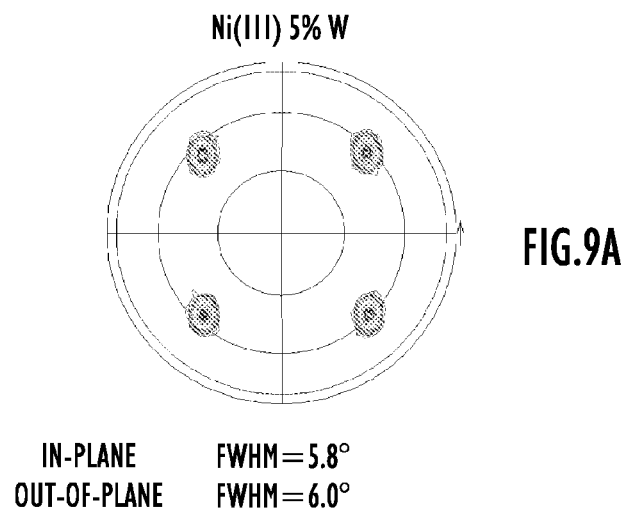
FIG. 9 illustrates pole figures of a metallic substrate (FIG. 9A), an LZO layer (FIG. 9B) and the CGO layer on the LZO layer (FIG. 9C), as well as the RHEED measurements of the LZO (FIG. 5D) and the CGO surfaces (FIG. 5E) produced in accordance with an embodiment of the present invention.
Figure 9B:
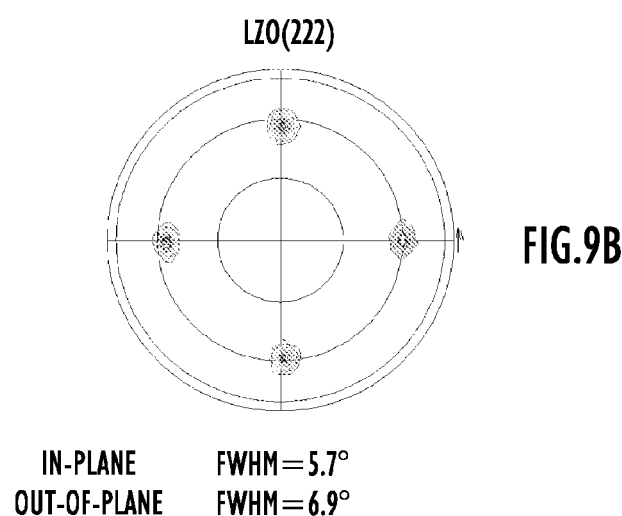
Figure 9C:
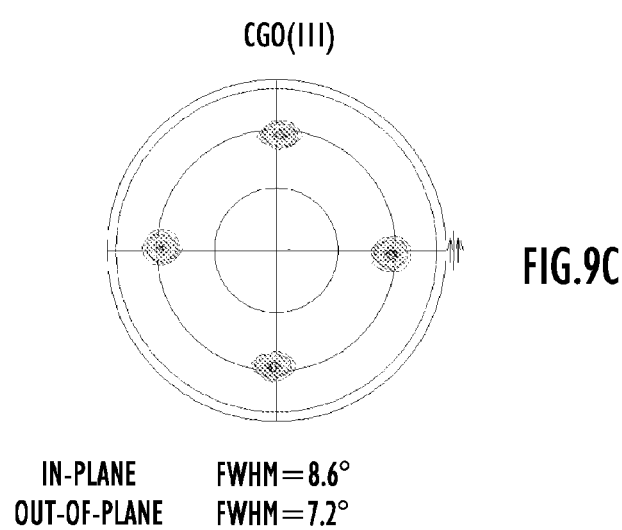
Figure 9E:
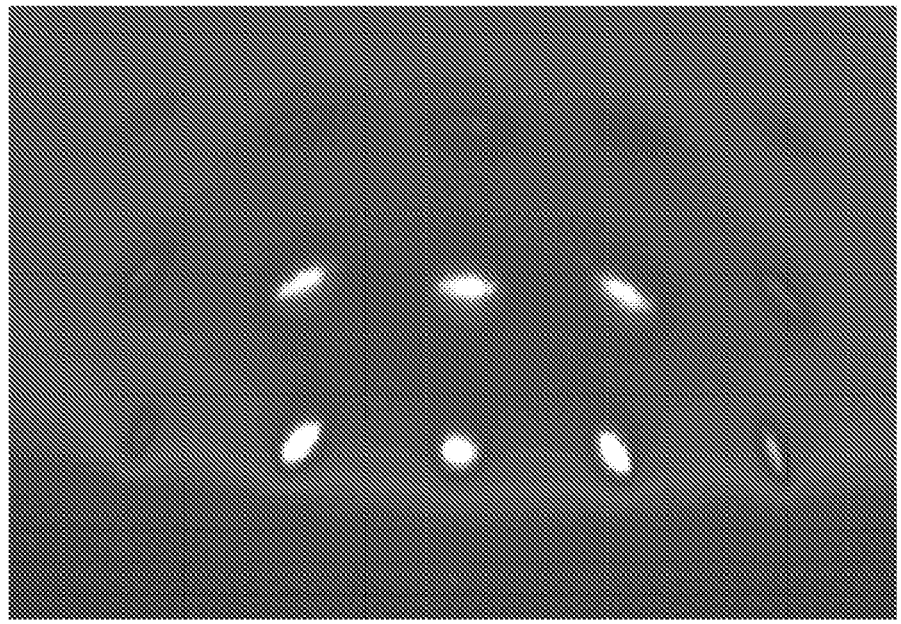
Figure 9D:
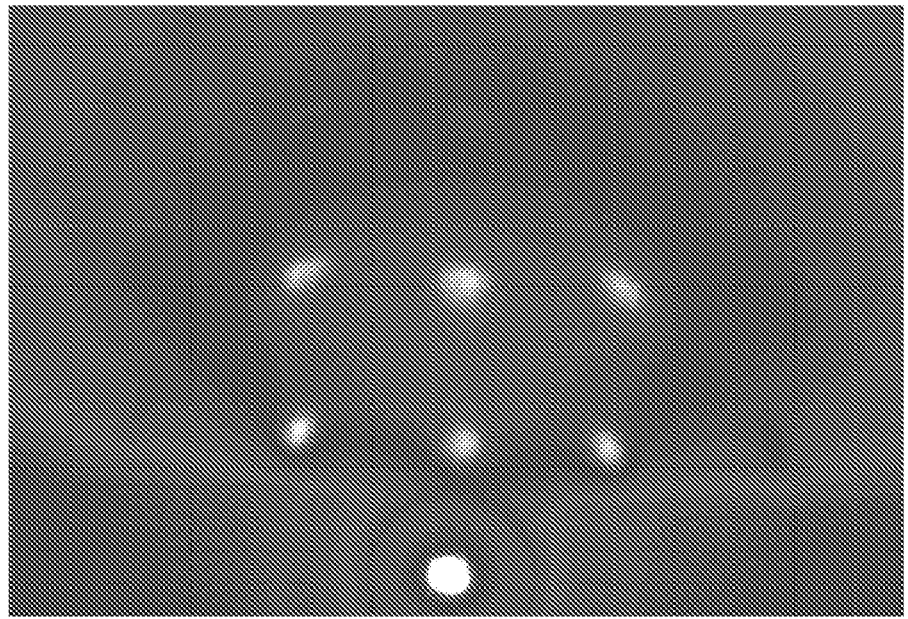

The coating was carried out on substrate bands with a cross-section of 5×0.1 mm$^2$ and a length of 50 m in a continuous coating apparatus. FIG. 8 illustrates diagram of a continuous coating apparatus 800 that may be used with the present invention. As shown, the apparatus consists of a rinsing (take-off) unit 805, a coating unit 810, a first drying unit 820, a second drying unit 830, and a winding unit 840. The band is drawn through the system by a drawing force of 10N at a rate of 5 cm/min. The tensile force is selected in this case so that it is less than the elastic limit of the metal band that is used. The coating may be carried out at a pull-out angle of about 70° relative to the solution surface. The pull-out angle can be varied within a range of 20-90°, whereby a smaller angle means a larger layer thickness. Equal layer thicknesses can be achieved with, e.g., the combination of 70° and 5 cm/min as well as 90° and 5.8 cm/min. The drying is carried out in two steps. The pre-drying is carried out below the boiling temperature of the solvent (methanol/65° C.) at temperatures of 60° C. on a 50 cm segment, and the final drying is carried out on a 100 cm segment at a temperature of 90° C. After drying, the band is wound up on a ceramic pipe (corundum) with a diameter of 20 cm and a length of 100 cm in the form of a spiral (solenoid).

The band is moved with the carrier pipe into an annealing furnace and crystallized at a temperature of 900° C. within 2 hours.

Studies by means of RHEED and x-ray diffractometry on selected short samples yielded measuring results that correspond to those of the measurements of samples of Example 1, produced according to the invention.

Example 4

In this example, a buffer system that consists of two layers of La$_2$Zr$_2$O$_7$ (LZO) and a layer of gadolinium-doped cerium oxide (CGO) was applied.

The first two layers were applied in succession, according to Example 3, while going through all described process steps. In addition, after this multiple coating, studies by means of RHEED and x-ray diffractometry on selected short samples showed measuring results that correspond to those of the measurements of samples of Example 1 produced according to the invention.

The coating solution for the gadolinium-doped cerium oxide is based on a mixture including cerium(III) acetylacetonate (Ce[CH$_3$COCH=C(O—)CH$_3$]$_3$.xH$_2$O (available from Alfa Aesarg®)) in 2-methoxyethanol (CH$_3$OCH$_2$CH$_2$OH, 99.8% anhydrous, boiling point 124° C. (available from Sigma-Aldrich, St. Louis, Mo., www.sigmaaldrich.com)), as well as Gd(III) acetylacetonate (Gd (CH$_3$CO$_2$)$_3$.xH$_2$O, 99.9% (available from Sigma-Aldrich)) in propionic acid (CH$_3$CH$_2$COOH, ≧99%, melting point −21° C., flash point 50° C. (available from Merck)). The ratio of gadolinium to cerium is approximately 0.01/1 to 0.1/1. The solution concentration was set at 0.2 M.

The coating solution was applied analogously to Example 3. The crystallization was carried out at temperatures of about 1000° C. within about one hour.

Referring to FIG. 9, the pole figures and the RHEED measurements show a very good crystal orientation and a high degree of texture of the surface.

Instead of a gadolinium-doped cerium oxide layer, a pure cerium oxide layer can be applied as an alternative. The coating solution consists here of Ce(III) acetate (Ce(III) acetate, Ce(CH$_3$COO)$_3$.xH$_2$O, 99.9% (available from Sigma-Aldrich)) dissolved in propionic acid (CH$_3$CH$_2$COOH, ≧99%, melting point −21° C., boiling point 141° C., flash point 50° C. (available from Merck)), 2-propanol ((CH$_3$)$_2$CHOH, 99.5%, boiling point 82° C. (available from Sigma-Aldrich)), and acetylacetone (CH$_3$COCH$_2$COCH$_3$, >99%, boiling point 140° C. (available from Sigma-Aldrich)). The solvents had the ratio 5:2:1, whereby it can be varied in a wide range with a proportion of propionic acid in amounts greater than about 50%. The solution concentration was set at 0.25 M. The coating solution was applied analogously to Example 3. The crystallization was carried out at temperatures of 950° C. within one hour. Pole figures and RHEED measurements showed results corresponding to those of the gadolinium-doped cerium oxide.

What is claimed is:

1. A method of producing band-shaped HTSL including a metal substrate, at least one buffer layer, and an HTSL that is located on the buffer layer, the method comprising:
   (a) providing a coating solution comprising a polar solvent with at least one free hydroxyl group;
   (b) applying the coating solution to the metal substrate;
   (c) drying the coating;
   (d) applying an annealing treatment to the coating to produce the buffer layer; and
   (e) applying the HTSL layer to the buffer layer
   wherein the polar solvent with at least one free hydroxyl group comprises propionic acid.

2. The method according to claim 1, wherein the coating solution further comprises one or more of a zirconium compound, a lanthanum compound, and a rare earth compound.

3. The method according to claim 2, wherein:
   the zirconium compound comprises zirconium(IV) 2,4-pentadionate;
   the lanthanum compound comprises lanthanum(III) 2,4-pentadionate; and
   the rare earth compound is selected from the group consisting of cerium(III) acetylacetonate, Gd(III) acetylacetonate, and yttrium(III) 2,4-pentadionate.

4. The method according to claim 1, wherein the coating solution further comprises lanthanum(III) 2,4-pentadionate and zirconium(II) 2,4-pentadionate dissolved in propionic acid.

5. The method according to claim 4, wherein the coating solution has a concentration in the range of 0.04 M to 0.5 M relative to La$_2$Zr$_2$O$_7$.

6. The method according to claim 1, wherein step (d) comprises applying the annealing treatment at temperatures of approximately 800°-900° C.

7. The method according to claim 1, wherein step (b) comprises (b.1) receiving the substrate into a dipping apparatus including a dipping basin, wherein the substrate is pulled from the dipping basin at a rate of between about 0.05 cm/s and about 0.5 cm/s.

8. The method according to claim 1, wherein step (b) comprises (b.1) receiving the substrate into a continuous coating apparatus, wherein the substrate is pulled out under a pull-out angle of between about 20° to 90° at a drawing speed of between about 0.05 cm/s and about 0.15 cm/s.

9. The method according to claim 1, wherein the coating solution comprises yttrium(III) 2,4-pentadionate dissolved in a mixture comprising 24%-100% propionic acid and at least one of methoxyl alcohol, acetyl acetone, methanol, isobutylamine.

10. The method according to claim 9, wherein step (d) comprises annealing the coating at a temperature of about 1000° C.

11. The method according to claim 1, wherein the coating solution further comprises a wetting agent.

12. The method according to claim 1, wherein (d) comprises (d.1) applying an annealing treatment to the coating to form a buffer layer comprising cerium oxide.

13. The method according to claim 12, wherein forming the buffer layer comprising cerium oxide produces gadolinium-doped cerium oxide.

14. A method of forming a band-shaped HTSL including a metal substrate, two buffer layers comprising $La_2Zr_2O_7$, a buffer layer comprising gadolinium-doped cerium oxide, and at least one HTSL layer, the method comprising:
  (a) producing a first coating solution comprising lanthanum(III) 2,4-pentadionate and zirconium(IV) 2,4-pentadionate dissolved in propionic acid;
  (b) applying the first coating solution to the metal substrate;
  (c) drying the coating;
  (d) applying a first annealing treatment to form a first $La_2Zr_2O_7$ buffer layer;
  (e) applying the first coating solution to the first buffer layer and drying the coating;
  (f) applying a second annealing treatment to form a second $La_2Zr_2O_7$ buffer layer;
  (g) producing a second coating solution comprising: cerium(III) acetylacetonate in 2-methoxyethanol, and gadolinium(III) acetylacetonate in propionic acid;
  (h) applying the second coating solution on the second $La_2Zr_2O_7$ buffer layer and drying the second coating;
  (i) applying a third annealing treatment to form a third buffer layer comprising gadolinium-doped cerium oxide; and
  (j) applying the HTSL layer to the third buffer layer,
  wherein the concentration of the second coating solution is 0.1 M to 0.4 M, relative to the overall metal content of $CeO_2/Gd_2O_3$.

15. A method of forming band-shaped HTSL including a metal substrate, two buffer layers comprising $La_2Zr_2O_7$, a buffer layer comprising cerium oxide, and at least one HTSL layer, the method comprising:
  (a) forming a first coating solution comprising lanthanum(III) 2,4-pentadionate and zirconium(IV) 2,4-pentadionate dissolved in propionic acid;
  (b) applying the first coating solution to the metal substrate and drying the coating;
  (c) applying an annealing treatment to form a first $La_2Zr_2O_7$ buffer layer;
  (d) applying the first coating solution to the first $La_2Zr_2O_7$ buffer layer and drying the coating;
  (e) applying a second annealing treatment to form a second $La_2Zr_2O_7$ buffer layer;
  (f) forming a second coating solution comprising:
    cerium(III) acetate dissolved in propionic acid,
    2-propanol, and
    acetyl acetone;
  (g) applying the second coating solution to the second $La_2Zr_2O_7$ buffer layer and drying the coating;
  (h) applying a third annealing treatment to form a third buffer layer comprising cerium oxide; and
  (g) applying an HTSL layer on the third buffer layer.

16. The method according to claim 15, wherein the second coating solution comprises at least 50% propionic acid.

17. The method according to claim 16, wherein the ratio of propionic acid:2-propanol:acetyl acetone is about 5:2:1.

18. The method according to one of claim 1, wherein the metal substrate is textured.

19. The method according to one of claim 1, wherein the metal substrate comprises pure nickel.

20. The method according to claim 1, wherein step (c) comprises:
  drying the coating solution at a first temperature below the boiling point of the polar solvent; and
  drying the coating at a second temperature above the boiling point of the polar solvent.

21. The method according to claim 1, further comprising (f) heating the coating solution before applying the solution to the substrate.

22. The method according to claim 1, wherein the coating solution further comprises a gelling agent.

* * * * *